(12) United States Patent
Lee et al.

(10) Patent No.: US 8,057,870 B2
(45) Date of Patent: Nov. 15, 2011

(54) COMPOSITION FOR FORMING GATE INSULATING LAYER OF ORGANIC THIN-FILM TRANSISTOR AND ORGANIC THIN FILM TRANSISTOR USING THE SAME

(75) Inventors: Jae-Min Lee, Daejeon Metropolitan (KR); Hyeon Choi, Daejeon Metropolitan (KR); Min-Jeong Lee, Daejeon Metropolitan (KR); Hee-Jung Kim, Daejeon Metropolitan (KR); Young-Whan Park, Daejeon Metropolitan (KR); Dong-Ryul Kim, Daejeon Metropolitan (KR)

(73) Assignee: LG Chem, Ltd., Seoul (KR)

( * ) Notice: Subject to any disclaimer, the term of this patent is extended or adjusted under 35 U.S.C. 154(b) by 450 days.

(21) Appl. No.: 12/226,955

(22) PCT Filed: May 3, 2007

(86) PCT No.: PCT/KR2007/002176
§ 371 (c)(1),
(2), (4) Date: Nov. 3, 2008

(87) PCT Pub. No.: WO2007/129832
PCT Pub. Date: Nov. 15, 2007

(65) Prior Publication Data
US 2009/0166613 A1  Jul. 2, 2009

(30) Foreign Application Priority Data

May 4, 2006  (KR) ........................ 10-2006-0040636

(51) Int. Cl.
*C09K 19/00* (2006.01)
(52) U.S. Cl. ... 428/1.33; 428/41.5; 257/40; 257/E51.001
(58) Field of Classification Search ............ 257/40, 257/E51.001; 428/1.33, 41.5
See application file for complete search history.

(56) References Cited

U.S. PATENT DOCUMENTS

| | | | |
|---|---|---|---|
| 5,177,173 A * | 1/1993 | Iwakiri et al. | 528/171 |
| 5,639,558 A * | 6/1997 | Tatsumi et al. | 428/458 |
| 6,611,096 B1 | 8/2003 | McCormick et al. | |
| 6,611,299 B1 | 8/2003 | Fujii et al. | |
| 7,005,674 B2 | 2/2006 | Lee et al. | |
| 2006/0124925 A1 * | 6/2006 | Kondo et al. | 257/40 |

* cited by examiner

*Primary Examiner* — Kenneth Parker
*Assistant Examiner* — Anthony Ho
(74) *Attorney, Agent, or Firm* — McKenna Long & Aldridge LLP (57) ABSTRACT

The present invention relates to a composition for forming a gate insulating layer of an organic thin film transistor comprising polyarylate, and an organic thin film transistor comprising a gate insulating layer, which is formed using the composition, in contact with an organic semiconductor channel.

19 Claims, 2 Drawing Sheets

COMPOSITION FOR FORMING GATE INSULATING LAYER OF ORGANIC THIN-FILM TRANSISTOR AND ORGANIC THIN FILM TRANSISTOR USING THE SAME

This application is a 371 national stage entry of International Application No. PCT/KR2007/002176, filed on May 3, 2007 that claims priority to Korean Patent Application No. 10-2006-0040636, filed on May 4, 2006, both of which are hereby incorporated by reference in their entirety.

TECHNICAL FIELD

The present invention relates to a composition for forming a gate insulating layer of an organic thin film transistor, and an organic thin film transistor using the same. Specifically, the present invention relates to a composition for forming a gate insulating layer of an organic thin film transistor which comprises polyarylate having an ester group on its backbone, and an organic thin film transistor using the same. This application claims priority benefits from Korean Patent Application No. 10-2006-0040636, filed in the Korean Industrial Property Office on May 4, 2006, the entire content of which is fully incorporated herein by reference.

BACKGROUND ART

The organic semiconductor material refers to an organic material exhibiting semiconductor properties which change the electrical conductivity according to the applied electric field, as compared with most of the conventionally known organic materials having the properties of electrical insulating materials which do not so. Various electric/electronic devices to which these organic semiconductor materials are applied are known, and examples thereof include an organic light emitting diode, an organic solar cell, and an organic thin film transistor.

The organic thin film transistor refers to a thin film transistor fabricated using a channel comprising an organic material having semiconductor properties. The organic thin film transistors typically consist of electrodes comprising a source, a drain, and a gate, an organic semiconductor channel, a gate insulating layer, and a substrate. These organic thin film transistors are advantageous in that they can be applied to a large area at low cost by using a solution process without a vacuum deposition process, and can also be used for flexible devices which are bendable, as compared with inorganic transistors using silicone, or the like.

The performance of the organic thin film transistors are determined, based on various factors including how effectively the potentials of the interface of the organic semiconductor are changed according to the gate electrode voltages, whether there exists any energy barrier blocking the carrier from being injected from a source electrode to an organic semiconductor, how many scattering elements exist while the carrier is transmitted along the interface of the organic semiconductor, and whether the gate insulating layer has sufficient insulating properties for preventing the carrier transmitted from the organic semiconductor from leaking to the gate electrode. Accordingly, in the development of the organic thin film transistors, the development of a gate insulating layer having excellent characteristics is also needed, as well as the development of a high-performance organic semiconductor channel material.

Conventionally known materials of a gate insulating layer for an organic thin film transistor can be divided into two types, that is, inorganic materials such as silicon oxide, silicon nitride, and aluminum oxide ($Al_2O_3$), and organic materials such as polyvinylphenol [Klauk et al., Journal of Applied Physics 92, 5259 (2002)], polyvinylalcohol [Schroeder et al., Applied Physics Letters 83, 3201 (2003)], polymethylmethacrylate [Ficker et al., Journal of Applied Physics 94, 2638 (2003)], and polyimide (Korean Patent Application Publication No. 2005-0081824).

If an inorganic insulating layer is used for the organic thin film transistor, the inorganic insulating layer should be prepared using a vacuum deposition process as in the conventional silicone semiconductors. As a result, it is disadvantageous in terms of the process and cost, and it is difficult to apply it for a large-area substrate. Further, it has low flexibility derived from its intrinsic property as the inorganic material, and relatively high process temperature. Accordingly, it is difficult to apply it for a flexible device such as a plastic substrate. Further, the inorganic insulating layer generally has a relatively low affinity with an organic semiconductor channel, which leads to undesirable performance of the organic thin film transistor device.

On the other hand, if an organic insulating layer is used in the organic thin film transistor, an insulating layer film can be prepared using a solution process. Thus, it has an advantage in that it can be applied on a large area at low cost, and it can be easily applied for a flexible device using a relevant low-temperature process and flexibility of the organic material. Further, the organic insulating layer is also superior to a predetermined kind of the inorganic insulating layer in that insulating layers having various characteristics can be prepared by introducing various designs and modifications of the chemical structures of the organic materials.

However, the materials for the organic gate insulating layer have been limited in their chemical structures and types until now. Accordingly, the development of the materials for the novel organic gate insulating layer is very important for realization of an organic thin film transistor. A number of insulating organic materials have been known, but there are still few insulating organic materials which are suitable for forming a gate insulating layer of an organic thin film transistor.

DISCLOSURE OF INVENTION

Technical Problem

The present inventors have found that advantageous effects can be achieved by forming a gate insulating layer in contact with an organic semiconductor channel of an organic thin film transistor using polyarylate.

Therefore, it is an object of the present invention to provide a composition for forming a gate insulating layer of an organic thin film transistor, and an organic thin film transistor using the same.

Technical Solution

The present invention provides a composition for forming a gate insulating layer of an organic thin film transistor, comprising polyarylate of the following formula 1.

[Formula 1]

(wherein Ar1 and Ar2 may be the same as or different from each other, and are each a substituted or unsubstituted aromatic group). The polyarylate preferably has a molecular weight of 5,000 or more and 1,000,000 or less, and more preferably 10,000 or more and 200,000 or less.

Further, the present invention provides an organic thin film transistor comprising a gate electrode, a gate insulating layer, an organic semiconductor channel, a drain electrode, and a source electrode. The gate insulating layer is in contact with the organic semiconductor channel, and comprises an insulating layer formed by using the composition for forming a gate insulating layer of an organic thin film transistor, comprising polyarylate represented by Formula 1.

Advantageous Effects

According to the present invention, a gate insulating layer can be formed through a solution process by forming the gate insulating layer in contact with an organic semiconductor channel of an organic thin film transistor using polyarylate having an ester group on its backbone. Further, an organic thin film transistor using the same can be prepared by using a process which is simpler and less expensive, as compared with conventional processes, and has excellent performances.

BEST MODE FOR CARRYING OUT THE INVENTION

Hereinbelow, the present invention will be described in detail.

Studies on an organic gate insulating layer have been conventionally made, which focus on vinyl polymers, acrylate polymers, imide polymers, or the like. Under these circumstances, the present invention is characterized in that a gate insulating layer is formed by using a polymer having the structure having an aromatic ester group on its backbone, as in the formula 1, that is, polyarylate.

Polyarylate has excellent UV stability, intrinsic flame retardancy, and electrical properties, and high thermal deformation temperature and transparency. These characteristics have allowed polyarylate to be used as an exterior material in solar light collecting safety devices, materials for structures/transporters, lamp cases of lightings and microwaves, internal and external parts of cameras, electronic/electric devices of optical equipments, or the like. However, any example in which polyarylate is used as a gate insulating layer of an organic thin film transistor has not been disclosed until now. Now, according to the present invention, it is found that the performance of the organic thin film transistor can be improved by using polyarylate as a gate insulating layer of an organic thin film transistor.

The materials for a gate insulating layer of an organic thin film transistor should satisfy predetermined requirements. In other words, the materials for a gate insulating layer of an organic thin film transistor should have a dielectric constant in a predetermined range which is not too high and not too low, and should have excellent electrical insulation characteristics such as a high insulating breakdown voltage, and a low leakage current. Specifically, it is desirable that the materials for a gate insulating layer of an organic thin film transistor should have a dielectric constant in the range of 2 or more and 10 or less, preferably in the range of 2 or more and 5 or less, more preferably in the range of 2 or more and 3 or less, an insulating breakdown voltage of 1 MV/cm or more, and a leakage current of $1 \times 10^{-7}$ A/cm$^2$ or less. Further, in order to improve the interfacial characteristics between the gate electrode and the organic semiconductor channel of the organic thin film transistor, as well as to satisfy the above-mentioned excellent electrical insulation characteristics, the gate insulating layer of the organic thin film transistor can function well when it satisfies the film surface characteristics such as a surface roughness of 1 nm or less, and a distilled water contact angle of 40 degrees or higher and 140 degrees or lower. According to the present invention, it has been found that the insulating layer formed by using polyarylate as a main component satisfies the above-described conditions, and based on this, an organic thin film transistor having excellent performance, using the same, can be prepared.

The polyarylate represented by Formula 1 is an aromatic linear polyester resin obtained by condensation polymerization of an aromatic diol compound represented by the following Formula 2 and an aromatic dicarboxylic acid compound represented by the following Formula 3.

HO—Ar1-OH      [Formula 2]

(wherein Ar1 is a substituted or unsubstituted aromatic group).

[Formula 3]

(wherein X and X' may be the same as or different from each other, and are each independently selected from the group consisting of OH, F, Cl, Br, and I, and Ar2 is a substituted or unsubstituted aromatic group).

Illustrative, but non-limiting examples of the aromatic diol compound represented by Formula 2 include bis(hydroxyaryl)alkane, bis(hydroxyaryl)cycloalkane, dihydroxydiarylether, dihydroxydiarylsulfide, dihydroxydiarylsulfoxide, dihydroxydiarylsulfone, dihydroxydiarylisatin, dihydroxybenzene, and dihydroxybiphenyl. Specific examples of the aromatic diol compound represented by Formula 2 include, but are not limited to the compounds of the following structural formulae.

Illustrative, but non-limiting examples of the aromatic dicarboxylic acid compound represented by Formula 3 include terephthalic acid, isophthalic acid, dibenzoic acid, naphthalenedicarboxylic acid, bis(4-carboxyphenyl)methane, 1,2-bis(4-carboxyphenyl)ethane, 2,2-bis(4-carboxyphenyl)propane, bis(4-carboxyphenyl)oxide, bis(4-carboxyphenyl)sulfide, bis(4-carboxyphenyl)sulfone, and the compounds as described above, in which the aromatic groups are substituted with $C_1$-$C_2$ alkyl or halogen groups, or a mixture thereof. Specific examples of the aromatic dicarboxylic acid compound represented by Formula 3 include, but are not limited to the compounds of the following structural formulae.

The polyarylate represented by formula 1 can be prepared as shown in the following Reaction scheme 1.

[Reaction scheme 1]

The polyarylate can be prepared by a solution polymerization method in which an aromatic diol compound and an aromatic dicarboxylic acid compound are dissolved in a single solution, and polymerized. Further, the polyarylate can also be prepared by an interfacial polymerization method in which an alkali aqueous solution of an aromatic diol compound and a halogenated solution of an aromatic dicarboxylic acid compound are mixed, and polymerized. Korean Patent Application No. 10-2004-0073870 describes, as the latter method, a method for preparing polyarylate having a reduced amount of residual salts, and improved transparency and heat resistance, the content of which is hereby incorporated by reference.

The polyarylate can have a molecular structural formula, which may vary depending on the used raw materials. Among these, polyarylate having the unit represented by the following formula 4 is preferred.

[Formula 4]

(wherein m and n are each independently a real number in the range of 0 or more and 1 or less, provided that m+n=1).

Further, a method in which a high-dielectric inorganic raw material is added to an organic material, or a high-dielectric inorganic raw material layer is laminated on an organic material layer, in order to increase the electric capacitance of an organic insulating layer, is known in the art. However, if the organic thin film transistor has a too high electric capacitance of the gate insulating layer, the stability of the device may deteriorate, for example, due to hysteresis caused by polarization of the insulating layer, and the on/off current ratio is undesirably reduced. Further, if the gate insulating layer having a lamination structure of several layers is formed, additional steps are required in the process, and the stability of the organic thin film transistor over time in the continuous operation may deteriorate. In particular, as for polyarylate, if a lot of heat is generated when inorganic materials are added in the above-described manner or when an inorganic material layer is laminated on an organic material layer comprising a polyarylate layer, the insulating layer may be non-uniform and the leakage current may be increased. For example, there may be exemplified a method for preparation of an inorganic material using a sol-gel reaction. In the case of the inorganic material prepared using the sol-gel reaction, particularly, of a silicone inorganic material such as an organic silane compound prepared using the sol-gel process, heat at a high temperature of 150° C. or higher is required in the process of forming a thin film, which makes the application of the material undesirable for the organic thin film transistor to be used in a process for forming a good insulating layer and a low-temperature process, and to be used as a flexible device. Accordingly, the composition for forming a gate insulating layer according to the present invention comprises polyarylate, but not an inorganic material obtained by a sol-gel reaction. Further, the organic thin film transistor according to the present invention, comprising the insulating layer obtained by using the composition, does not have a structure laminated with a layer comprising the inorganic material obtained by the sol-gel reaction as described above.

In addition, the insulating layer that is made of a composition for forming a gate insulating layer of an organic thin film transistor according to the present invention is characterized in that it is disposed to be in contact with the organic semiconductor channel in the organic thin film transistor of the present invention. That is, in the organic thin film transistor of the present invention, another layer such as an insulating layer comprising other materials is not interposed between the insulating layer comprising the composition according to the present invention and the organic semiconductor channel. In the present invention, an organic thin film transistor having excellent performances can be provided by forming a gate insulating layer which is in contact with the organic semiconductor channel of the organic thin film transistor, using the composition according to the present invention having excellent interfacial characteristics with the organic semiconductor channel, in the formation of a thin film, as described above.

The composition for forming a gate insulating layer of an organic thin film transistor according to the present invention can comprise a solvent, in addition to polyarylate as described above.

As the solvent, aliphatic hydrocarbons such as hexane, aromatic hydrocarbons such as anisole, mesitylene, and xylene, halogenated aliphatic hydrocarbons such as methylene chloride, chloroform, dichloroethane, and trichloroethane, halogenated aromatic hydrocarbons such as monochlorobenzene, dichlorobenzene, and trichlorobenzene, ketone solvents such as methylisobutylketone, 1-methyl-2-pyrrolidinone, and acetone, ether solvents such as cyclohexanone, tetrahydrofuran, and isopropyl ether, acetate solvents such as ethyl acetate, butyl acetate, and propylene glycol methyl ether acetate, alcohol solvents such as isopropyl alcohol, and butyl alcohol, amide solvents such as dimethyl acetamide, and dimethyl foramide, silicone solvents, or a mixture thereof can be used, but not limited thereto.

In the present invention, the composition for forming a gate insulating layer is applied on the gate electrode of the organic thin film transistor, using a method such as spin-coating, dip-coating, printing, spray-coating, and roll-coating, and then the solvent was dried to form a gate insulating layer of the organic thin film transistor.

In the present invention, an additive can be added to give other functions to the composition for forming a gate insulating layer within the range which does not interfere with the purpose of the present invention. For example, a coating improving agent can be added so as to improve the coating property of the composition.

The organic thin film transistor according to the present invention comprises a gate electrode, a gate insulating layer, an organic semiconductor channel, a source electrode, and a drain electrode. The organic thin film transistor according to the present invention can further comprise a substrate below the gate electrode. The organic thin film transistor according to the present invention can have a structure well known in the art, except that the gate insulating layer is formed of the composition for forming a gate insulating layer, comprising polyarylate as described above.

Figure 1:
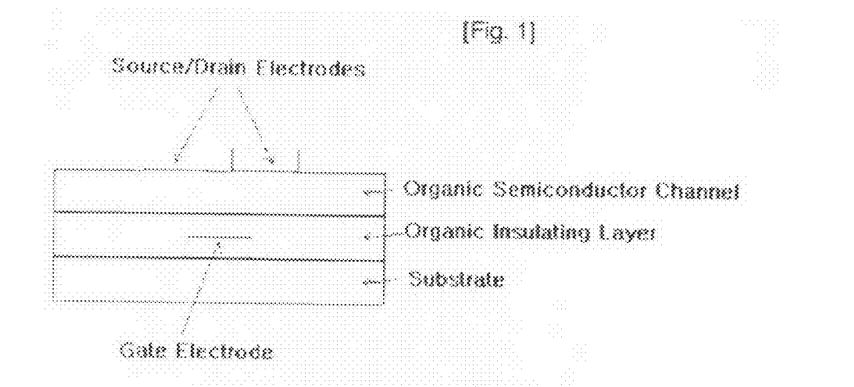
FIG. 1 illustrates the structure of an organic thin film transistor having a typical top-contact structure.

FIG. 1 is a view illustrating the structure of the organic thin film transistor according to the present invention. However, the organic thin film transistor as shown in FIG. 1 is provided only for illustrative purpose, and the organic thin film transistor of the present invention can have various structures within the range which does not interfere with the purpose of the present invention.

As the substrate, silicone, glass, plastic, paper, or the like can be used, but not limited thereto.

The organic semiconductor channel can be generally formed of an organic material having a semiconductor property. Specific examples of the organic material include, but are not limited to pentacene, a thiophene oligomer, arylamine, phthalocyanine, fullerene, polythiophene, polyfluorene, polyphenylenevinylene, polyarylamine, or a derivative or mixture thereof.

For the source, drain, and gate electrodes, commonly used metals such as gold (Au), platinum (Pt), silver (Ag), palladium (Pd), aluminum (Al), nickel (Ni), and chrome (Cr), conductive metal oxides such as indium tin oxide, indium zinc oxide, and nickel oxide, or conductive polymers such as polyaniline, polypyrrole, and polyethylene-dioxythiophene can be used, but not limited thereto.

The organic thin film transistor according to the present invention can be applied for other electronic devices, such as an organic light emitting device, a solar cell, an ID tag, an e-watermark, an e-barcode, and an e-ticket.

Mode for the Invention

Hereinbelow, the present invention will be described with reference to Examples below. A better understanding of the present invention may be obtained in light of the following Examples which are set forth to illustrate, but are not to be construed to limit the present invention.

Preparation Example 1

Preparation of Polyarylate (1)

To a 500-mL reactor equipped with a stirrer, 6.962 g of 2,2-bis(4-hydroxyphenyl)propane, 0.038 g of phenol, 62 g of distilled water, and 2.57 g of NaOH were added, and stirred. Then, the temperature of the reactor was set at 20° C., and 1.2 g of aqueous solution containing 5 wt % EMULGEN120® (polyoxyethylene lauryl ether, HLB (Hydrophile-Lipophile Balance): 15.3), and 6.2 g of methylene chloride were added thereto, and stirred, thereby preparing the alkali aqueous solution. Moreover, 6.22 g of an aromatic dicarboxylic acid mixture containing the same molar ratio of isophthaloyl chloride and terephthaloyl chloride was dissolved in 55 g of methylene chloride. This solution was added to the alkali aqueous solution which had been prepared in advance. The obtained mixture was polymerized at ambient temperature for 2 hours, and acetic acid was added thereto to complete the reaction. Then, the mixture was washed with a 1-fold volume of methylene chloride, and a 2-fold volume of distilled water five times. Washing was repeated until the conductivity of the filtrate was 50 □/cm or lower, and the solution was poured into methanol to precipitate polymers. These precipitates were dried in a vacuum oven to obtain a polymer having a weight average molecular weight of 200,000.

Preparation Example 2

Preparation of Polyarylate (2)

A polymer having a weight average molecular weight of 116,000 was prepared in the same manner as in Preparation Example 1, except that a monomer mixture of 2,2-bis(4-hydroxyphenyl)propane and 2,2-bis(4-hydroxyphenyl)sulfone at a molar ratio of 9:1 was used instead of 2,2-bis(4-hydroxyphenyl)propane.

Preparation Example 3

Preparation of Polyarylate (3)

A polymer having a weight average molecular weight of 27,000 was prepared in the same manner as in Preparation Example 1, except that a monomer mixture of 2,2-bis(4-hydroxyphenyl)propane and 2,2-bis(4-hydroxyphenyl)sulfone at a molar ratio of 3:1 was used instead of 2,2-bis(4-hydroxyphenyl)propane.

EXAMPLES

Example 1

The organic thin film transistor as shown in FIG. 1 was fabricated, using the polyarylate (1) as prepared in Preparation Example 1.

Specifically, ITO pattered on a glass substrate was used as a gate electrode, which was first washed with acetone and methanol. The polyarylate (1) was dissolved in chlorobenzene, and then applied on the gate electrode by using spin-coating to form an organic gate insulating layer having a thickness of about 3600 Å. Pentacene as an organic semiconductor channel was deposited on the organic gate insulating layer in a high vacuum of $1 \times 10^{-7}$ torr at a rate of about 0.3 Å/s to a thickness of 500 Å. Gold was deposited in a high vacuum of $1 \times 10^{-6}$ torr at a rate of 2 Å/s to a thickness of 1000 Å using a shadow mask to form source and drain electrodes. The channel had a width of 1000 μm, and a length of 100 μm.

Example 2

An organic thin film transistor was prepared in the same manner as in Example 1, except that the polyarylate (2) as prepared in Preparation Example 2 was used instead of the polyarylate (1) as prepared in Preparation Example 1.

Example 3

An organic thin film transistor was prepared in the same manner as in Example 1, except that the polyarylate (3) as prepared in Preparation Example 3 was used instead of the polyarylate (1) as prepared in Preparation Example 1.

Evaluation of Electrical Properties of Organic Thin Film Transistor

The electrical properties of the organic thin film transistor as prepared in Examples 1 to 3 were measured using an HP4155C Semiconductor Parameter Analyzer at normal temperature in the atmosphere. Under a drain voltage of −40 V, the gate voltages were scanned in the range of +20 to −40 V, and thus a current-voltage curve (transfer curve) was obtained. From the following equation showing the relationship between current and voltage in the saturation region, the mobility and the threshold voltage of the organic thin film transistor can be determined.

$$I_D = \frac{W}{2L} C_{ins} \mu_{sat} (V_G - V_T)^2$$

($I_D$: drain current, W: channel width, L: channel length, $C_{ins}$: electric capacitance of insulating layer, $\mu_{sat}$: saturation region mobility, $V_G$: gate voltage, and $V_T$: threshold voltage)

Figure 2:
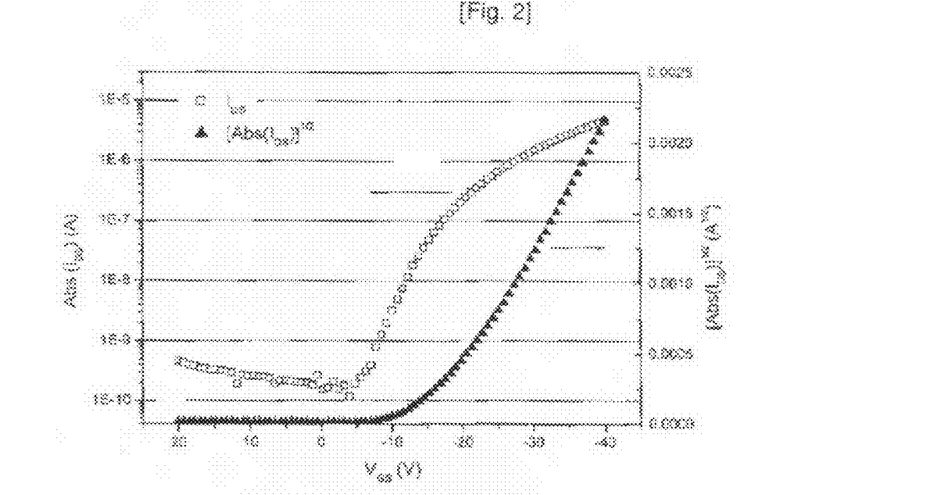
FIG. 2 illustrates the current-voltage curve (transfer curve) of the organic thin film transistor as prepared in Example 1.
Figure 3:
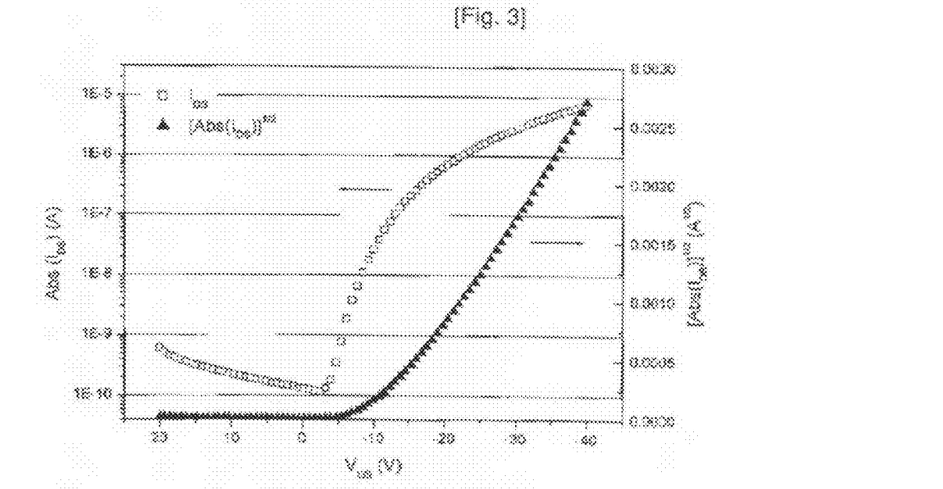
FIG. 3 illustrates the current-voltage curve (transfer curve) of the organic thin film transistor as prepared in Example 2.
Figure 4:
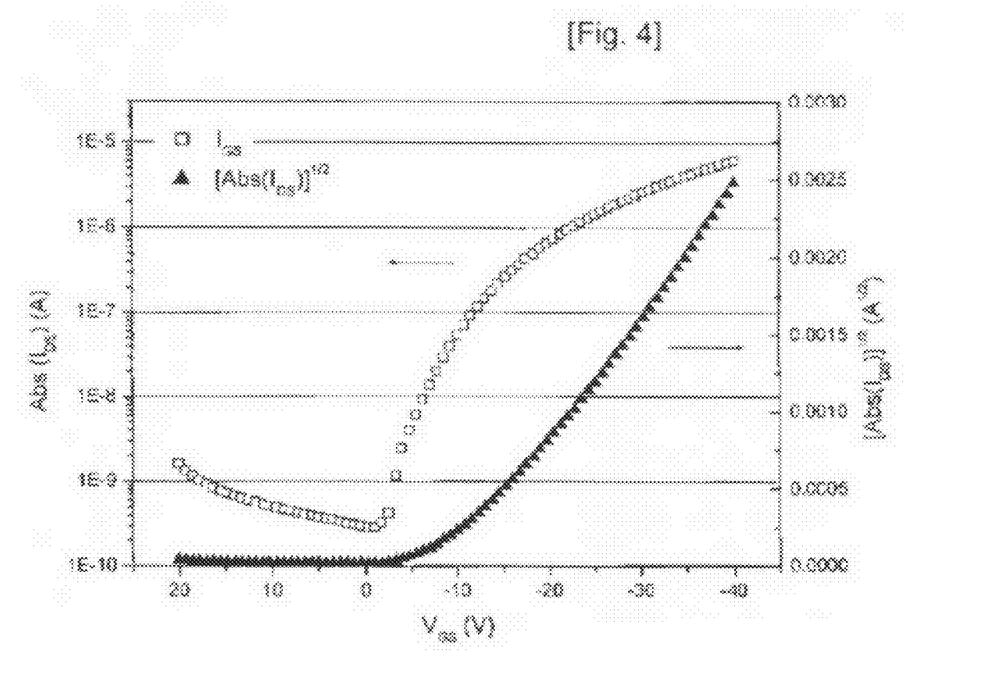
FIG. 4 illustrates the current-voltage curve (transfer curve) of the organic thin film transistor as prepared in Example 3.

The current-voltage curves (transfer curves) of the organic thin film transistors as prepared in Examples 1 to 3 are shown in FIGS. 2 to 4. Further, the performances of the organic thin film transistors as prepared in Examples 1 to 3 are compared, as shown in Table 1.

TABLE 1

|  | Mobility (cm²/Vs) | On/off ratio | $V_T$ (V) |
| --- | --- | --- | --- |
| Example 1 | 0.22 | 40000 | −15.2 |
| Example 2 | 0.25 | 63000 | −11.9 |
| Example 3 | 0.19 | 22000 | −10.5 |

The invention claimed is:

1. A composition for forming a gate insulating layer of an organic thin film transistor, comprising polyarylate represented by the following Formula 1:

[Formula 1]

wherein Ar1 and Ar2 may be the same as or different from each other, and are each a substituted or unsubstituted aromatic group;

wherein the dielectric constant of the composition is 2 or more and 10 or less, the insulating breakdown voltage of the composition is 1 MV/cm or more, and the leakage current of the composition is $1 \times 10^{-7}$ A/cm² or less.

2. The composition for forming a gate insulating layer of an organic thin film transistor according to claim 1, wherein the polyarylate represented by Formula 1 is prepared by condensation polymerization of an aromatic diol compound represented by the following Formula 2 and an aromatic dicarboxylic acid compound represented by the following Formula 3:

HO—Ar1—OH [Formula 2]

wherein Ar1 is a substituted or unsubstituted aromatic group,

[Formula 3]

wherein X and X' may be the same as or different from each other, and are each independently selected from the group consisting of OH, F, Cl, Br, and I, and Ar2 is a substituted or unsubstituted aromatic group.

3. The composition for forming a gate insulating layer of an organic thin film transistor according to claim 2, wherein the compound represented by Formula 2 is at least one selected from the group consisting of bis(hydroxyaryl)alkane, bis(hydroxyaryl)cycloalkane, dihydroxydiarylether, dihydroxydiarylsulfide, dihydroxydiarylsulfoxide, dihydroxydiarylsulfone, dihydroxydiarylisatin, dihydroxybenzene, and dihydroxybiphenyl.

4. The composition for forming a gate insulating layer of an organic thin film transistor according to claim 2, wherein the compound represented by Formula 2 is at least one selected from the group consisting of the compounds represented by the following structural formulae:

5. The composition for forming a gate insulating layer of an organic thin film transistor according to claim 2, wherein the aromatic dicarboxylic acid compound represented by Formula 3 is at least one selected from the group consisting of terephthalic acid, isophthalic acid, dibenzoic acid, naphthalenedicarboxylic acid, bis(4-carboxyphenyl)methane, 1,2-bis(4-carboxyphenyl)ethane, 2,2-bis(4-carboxyphenyl)propane, bis(4-carboxyphenyl)oxide, bis(4-carboxyphenyl)sulfide, bis(4-carboxyphenyl)sulfone, and the compounds as described above, in which the aromatic groups are substituted with $C_1$-$C_2$ alkyl or halogen groups.

6. The composition for forming a gate insulating layer of an organic thin film transistor according to claim 2, wherein the aromatic dicarboxylic acid compound represented by Formula 3 is at least one selected from the group consisting of the compounds of the following structural formulae:

-continued

7. The composition for forming a gate insulating layer of an organic thin film transistor according to claim 1, wherein the polyarylate represented by Formula 1 comprises the unit of the following Formula 4:

[Formula 4]

wherein m and n are each independently a real number in the range of 0 or more and 1 or less, provided that m+n=1.

8. The composition for forming a gate insulating layer of an organic thin film transistor according to claim 1, further comprising a solvent.

9. The composition for forming a gate insulating layer of an organic thin film transistor according to claim 8, wherein the solvent is selected from the group consisting of aliphatic hydrocarbons, aromatic hydrocarbons, halogenated aliphatic hydrocarbons, halogenated aromatic hydrocarbons, ketone solvents, ether solvents, acetate solvents, alcohol solvents, amide solvents, silicone solvents, and a mixture thereof.

10. The composition for forming a gate insulating layer of an organic thin film transistor according to claim 1, wherein the polyarylate has a molecular weight of 5,000 or more and 1,000,000 or less.

11. The composition for forming a gate insulating layer of an organic thin film transistor according to claim 1, wherein the dielectric constant is 2 or more and 3 or less.

12. The composition for forming a gate insulating layer of an organic thin film transistor according to claim 1, wherein a film that is formed by using the composition has a surface roughness of 1 nm or less and a distilled water contact angle of 40 degrees or higher and 140 degrees or lower.

13. An organic thin film transistor comprising a gate electrode, a gate insulating layer, an organic semiconductor channel, a drain electrode, and a source electrode, wherein the gate insulating layer is in contact with the organic semiconductor channel, and comprises an insulating layer formed by using the composition for forming the gate insulating layer according to claim 1.

14. The organic thin film transistor according to claim 13, wherein the organic semiconductor channel is formed of a material selected from the group consisting of pentacene, a thiophene oligomer, arylamine, phthalocyanine, fullerene, polythiophene, polyfluorene, polyphenylenevinylene, polyarylamine, and a mixture thereof.

15. The organic thin film transistor according to claim 13, further comprising a substrate below the gate electrode.

16. An electronic device comprising the organic thin film transistor according to claim 13.

17. The electronic device according to claim 16, wherein the electronic device is selected from the group consisting of an organic light emitting device, a solar cell, an ID tag, an e-watermark, an e-barcode, and an e-ticket.

18. The organic thin film transistor according to claim 13, wherein the polyarylate represented by Formula 1 comprises the unit of the following Formula 4:

[Formula 4]

wherein m and n are each independently a real number in the range of 0 or more and 1 or less, provided that m+n=1.

19. The organic thin film transistor according to claim 13, wherein the composition for forming a gate insulating layer has the dielectric constant of 2 or more and 10 or less, the insulating breakdown voltage of 1 MV/cm or more, and the leakage current of $1\times10^{-7}$ A/cm$^2$ or less.

* * * * *